United States Patent [19]

Tanigawa et al.

[11] Patent Number: 5,134,304
[45] Date of Patent: Jul. 28, 1992

[54] LIGHT PROJECTING CIRCUIT IN A PHOTOELECTRIC SWITCH

[75] Inventors: Kiyoshi Tanigawa; Ken-Ichi Sakanoue, both of Tochigi, Japan

[73] Assignee: Fuji Electric Co., Ltd., Japan

[21] Appl. No.: 700,758

[22] Filed: May 15, 1991

[30] Foreign Application Priority Data

May 15, 1990 [JP] Japan .................................. 2-124564
Sep. 28, 1990 [JP] Japan .................................. 2-260865

[51] Int. Cl.⁵ .............................................. H01J 40/14
[52] U.S. Cl. ................................. 250/214 R; 250/222.1
[58] Field of Search ............... 250/551, 214 R, 213 A, 250/221, 222.1; 307/311; 340/555, 556, 557

[56] References Cited

U.S. PATENT DOCUMENTS 4,658,129 4/1987 Fan .................................. 250/214 R
5,030,822 7/1991 Fukuyama ..................... 250/214 R Primary Examiner—David C. Nelms
Assistant Examiner—K. Shami
Attorney, Agent, or Firm—Brumbaugh, Graves, Donohue & Raymond

[57] ABSTRACT

The present invention relates to a photoelectric switch which has a light projecting means that projects light pulses as a result of a pulse signal and a light receiving means that receives the light pulses and outputs a light receiving signal. In one arrangement an enhanced voltage of about two times the supply voltage is applied to a light projecting element, such as an LED, thereby making it possible to provide a photoelectric switch which operates at a reduced power supply voltage. By providing a composite LED drive voltage the drop in supply voltage, inherent in conventional photoelectric switches when the output circuit is activated (thereby reducing the voltage to the light emitting element) does not inhibit operation.

13 Claims, 3 Drawing Sheets

LIGHT PROJECTING CIRCUIT IN A PHOTOELECTRIC SWITCH

FIELD OF THE INVENTION

The present invention relates to a photoelectric switch which is disposed with a light projecting mean that projects a pulse light and a light receiving means that receives the pulse light from the light projecting means and outputs a light receiving signal. Based upon the output from the light receiving means, the device detects the presence of an object by determining whether the object reflects or shields the pulse light from the light projecting means.

BACKGROUND OF THE INVENTION

FIG. 6 illustrates a conventional photoelectric switch in which reference numeral 1 is a pulse generating circuit; 2 is a light emitting diode driving circuit (hereinafter called the LED driving circuit) which comprises a series circuit of a light emitting diode 23 (hereinafter called the LED), a transistor 21 and a resistor 22, and series connected resistors 24 and 25 coupled to the output end of the pulse generating circuit 1. The base of transistor 21 is connected to the point between the resistors 24 and 25. Reference numeral 3 is a light receiving element, and reference numeral 4 is a light receiving circuit. Reference numeral 5 is an output circuit that includes a Zener diode 51, a resistor 52 and an output transistor 53. The base of the output transistor 53 is connected to a series circuit that includes a transistor 54 driven by the output of the light receiving circuit 4. Reference numeral 6 is a constant voltage power supply circuit and reference numeral 7 is a smoothing capacitor. Reference numeral 10 is a power supply circuit connected in series with the load 11 to the output terminals (T1 and T2) of the photoelectric switch.

In the conventional photoelectric switch of FIG. 6, when the power supply 10 and the load 11 are connected to the output terminals (T1 and T2) the smoothing capacitor 7 is charged to a predetermined voltage via the constant voltage power supply 6. When a pulse voltage is output from the pulse generating circuit 1, the transistor 21 is activated, and a current flows from the capacitor 7 to the LED 23. When the current flows through the LED 23, a pulse light is emitted by the LED 23. The light receiving element 3 receives the pulse light from the LED 23 and converts it to an electric signal. The output of the light receiving element 3 is amplified and detected by the light receiving circuit 4, and is output as a detected output in accordance with the intensity of the light received. When the detected output is output from the light receiving circuit 4, the transistor 54 is activated. A base current flows into the output transistor 53 via the transistor 54 and the Zener diode 51 activating the transistor 53 and driving the load 11. At this time, the voltage across the output transistor 53 is nearly the sum of the Zener voltage $V_z$ of the Zener diode and the drop in the base emitter voltage $V_{bc}$ across the output transistor 53.

The light projecting circuit of the conventional photoelectric switch described above requires a high voltage for the LED driving circuit due to the large voltage drop across the LED 23. In addition, the power supply voltage must be large since there is a large voltage drop between the output terminals (T1 and T2) when the photoelectric switch is turned on. This reduces the voltage applied to the load, resulting in a deficiency.

SUMMARY OF THE INVENTION

Therefore, the present invention provides a photoelectric switch having light projecting circuitry which is capable of eliminating the shortcomings of the conventional photoelectric switch. The invention also describes an LED having a large voltage drop without raising the power supply voltage for the photoelectric switch.

To achieve the above objective, a first preferred embodiment of the present invention is characterized in that, in a light projecting circuit in a photoelectric switch which emits a pulse light by supplying a pulse current to a light emitting diode, there is (1) a pulse generating circuit that generates a pulse voltage; (2) a switching circuit that is driven by the pulse generating circuit, and in which the output voltage is used as a reference potential for the circuit power supply voltage; and (3) an LED driving circuit that includes a light emitting diode is connected between a charging circuit connected across the output of the switching circuit and a capacitor, and between a point connecting the charging circuit with the capacitor and the reference potential. The light emitting diode driving circuit and the switching circuit are operated simultaneously by the pulse generating circuit. Furthermore, the switching circuit is a series circuit comprising a switching element and a resistor; the charging circuit is a resistor connected between the power supply circuit and the capacitor; and the LED driving circuit is connected between the point connecting the resistor with the capacitor and the reference potential. The switching circuit comprises two switching elements connected in series, either of which is driven by the pulse generating circuit. The charging circuit is a series circuit comprising the diode and the resistor connected between the power supply circuit and the capacitor. The LED driving circuit is connected between the point connecting the resistor and the capacitor and the reference potential.

Another preferred embodiment of the present invention is characterized in that a light projecting circuit in a photoelectric switch is disposed with a constant voltage power supply circuit that is connected between two output terminals and outputs a predetermined voltage. A pulse generating circuit connects to the constant voltage power supply circuit and outputs a pulse voltage. An LED driving circuit is driven by this pulse generating circuit and includes a light emitting element. A pulse light is generated as a result of a pulse current which flows into the light emitting element. The light projecting circuit is disposed with a series circuit comprising a resistor connected across the output terminals and a power supply capacitor. The light projecting circuit also has a switching circuit in which transistor collectors and emitters are connected in series with the resistor in parallel with the power supply capacitor. The transistors are driven by the pulse generating circuit. An auxiliary capacitor is connected to the output ends of the switching circuit and is charged via the charging resistor. This preferred embodiment also includes a feed switching means driven by the pulse generating circuit in which the LED driving circuit is connected in parallel with the power supply capacitor and in series with the diodes and the LED driving circuit switches the sum of the voltage across the auxiliary capacitor and the output voltage of the switching circuit or the voltage across the power supply capacitor as a function of the state of the output circuit which is driven by the light receiving circuit. The feed switching means comprises transistors in which the charging resistor is connected to the power supply capacitor. The transistors are connected between the point connecting the charging resistor with the power supply capacitor and the point connecting the diodes with the switching elements. In the above configuration, the transistors are controlled by turning on and off the output circuit driven by the light receiving circuit. In this embodiment, the auxiliary capacitor is charged by the output voltage of the constant voltage power supply circuit, and the feed switching means comprises the diodes connected between the connecting points of the charging resistor and the auxiliary capacitor, and between the diodes and the light emitting elements. Furthermore, the charging resistor is connected to the power supply capacitor, and the feed switching means comprises transistors of which the emitters and collectors are connected between the output end of the pulse generating circuit and the input end of the switching circuit. The transistors are controlled by turning on and off the output circuit driven by the light receiving circuit. As a result, the points between the point connecting the charging resistor with the auxiliary capacitor and the point connecting the diodes with the switching elements are short circuited.

In the light projecting circuit of the first preferred embodiment, the output of the switching circuit approximates the reference potential when the output voltage of the pulse generating circuit is "0" (i.e.—approximately equal to the reference potential), and the voltage across the capacitor charged via the charging circuit approximates the circuit voltage. When the output of the pulse generating circuit is "1" (i.e.—a pulse output is present), the output of the switching circuit approaches that of the circuit voltage, and a composite voltage is generated at the power supply side of the capacitor at twice the intensity of the circuit voltage, the composite voltage being the sum of the output voltage of the switching circuit and the charging voltage of the capacitor. By applying this voltage to the LED driving circuit, the LED can be operated even at relatively low supply voltages.

While the output circuit is turned on, the light projecting circuit keeps the auxiliary capacitor charged when the output voltage from the pulse generating circuit is "0", and the sum of the voltage across the auxiliary capacitor and the output voltage from the switching circuit is supplied to the LED driving circuit when the output voltage from the pulse generating circuit is "0". When the output circuit is turned off, the voltage across the power supply capacitor is supplied, with the circuit switched by means of the feed switching means.

BRIEF DESCRIPTION OF THE DRAWINGS

FIGS. 1 and 2 are circuit diagrams of the photoelectric switch according to the first preferred embodiment and FIGS. 3 through 5 are circuit diagrams of the photoelectric switch according to the second preferred embodiment.

DESCRIPTION OF THE PREFERRED EMBODIMENTS

The embodiments of the present invention will be explained with reference to the drawings.

Figure 1:
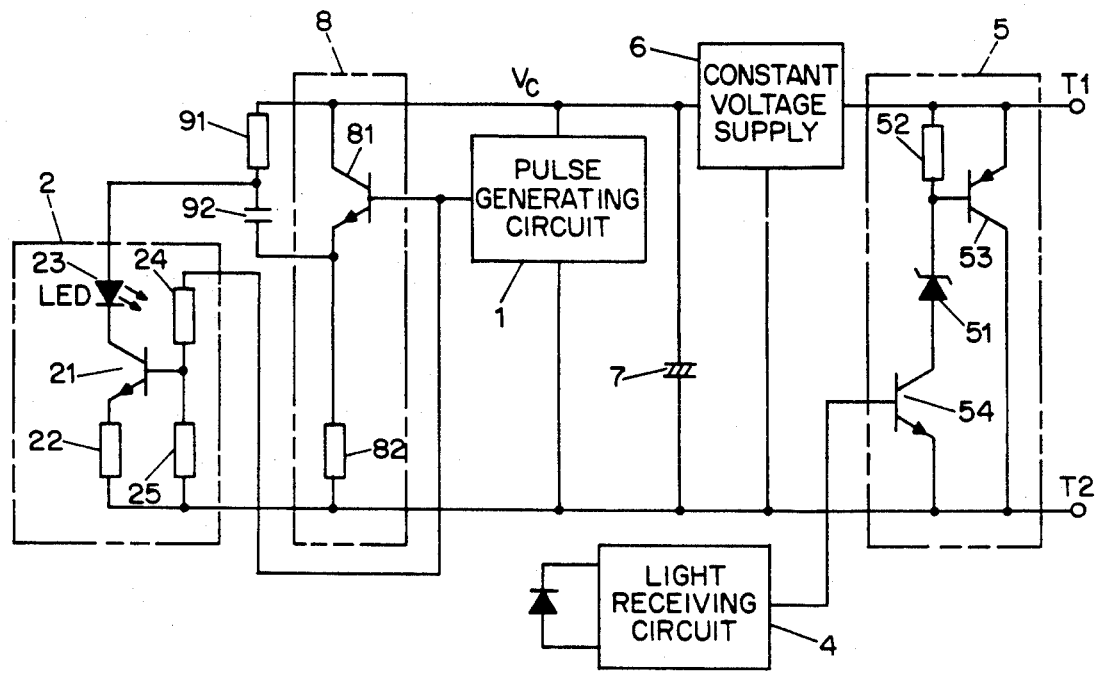
FIGS. 1, 2, 3, 4, and 5 are circuit diagrams illustrating the embodiments of the photoelectric switch according to the present invention.
Figure 2:
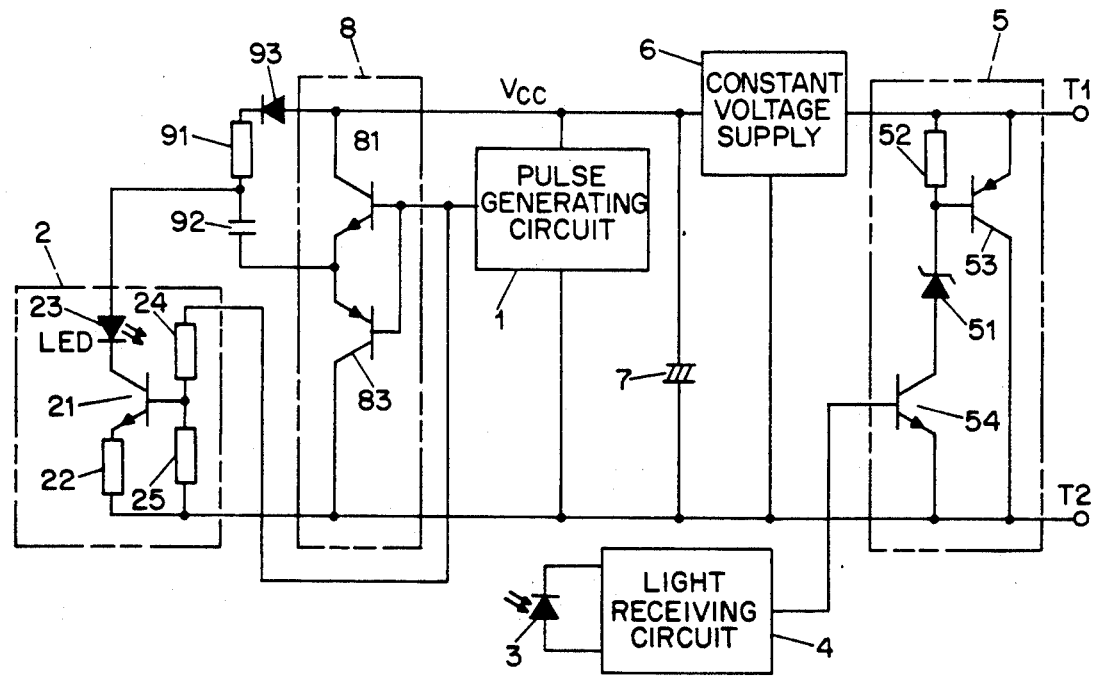
Figure 3:
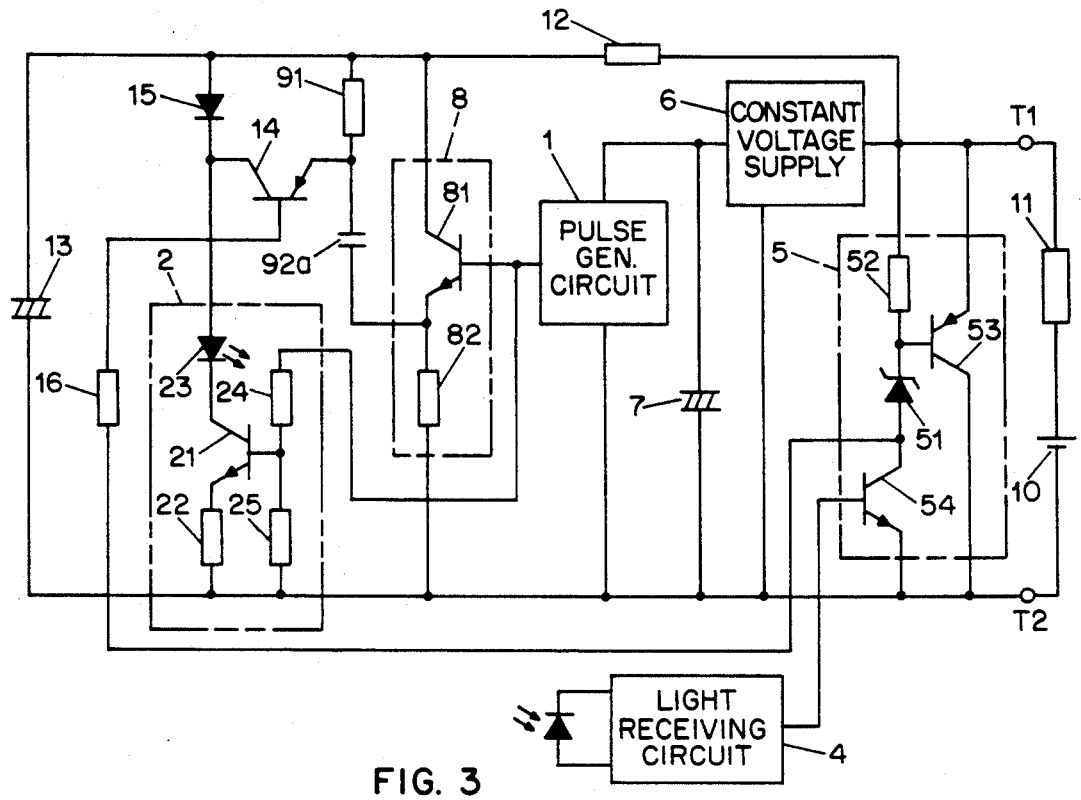
Figure 4:
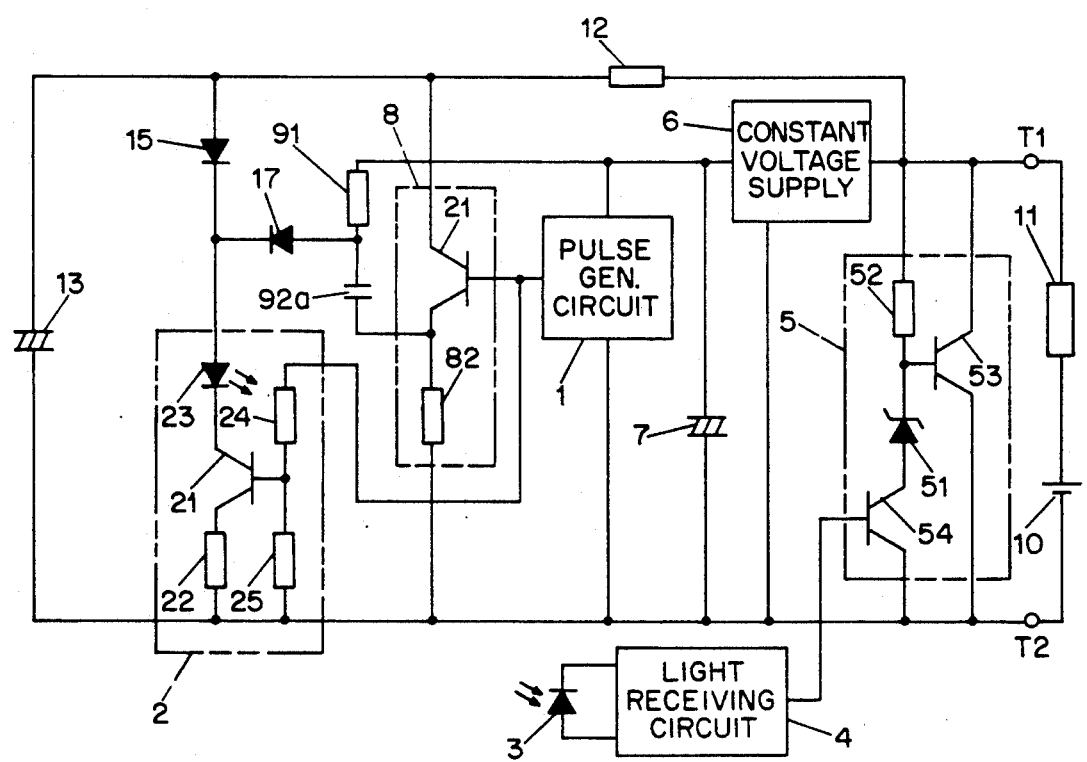
Figure 5:
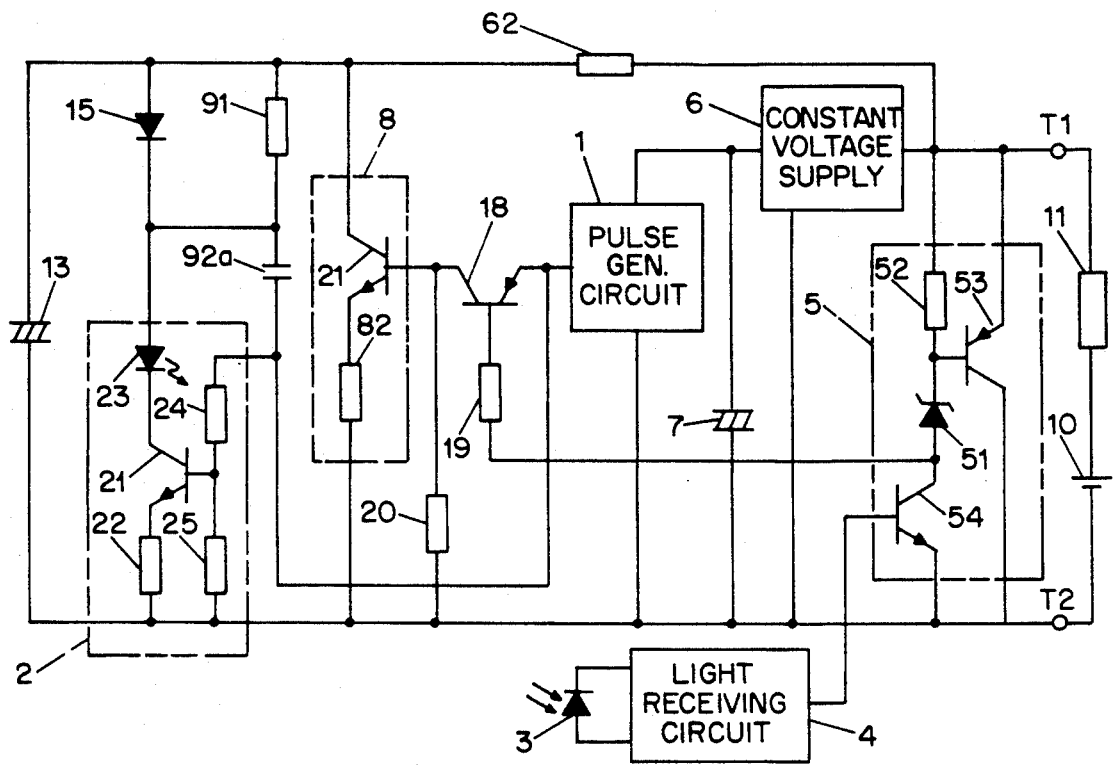
Figure 6:
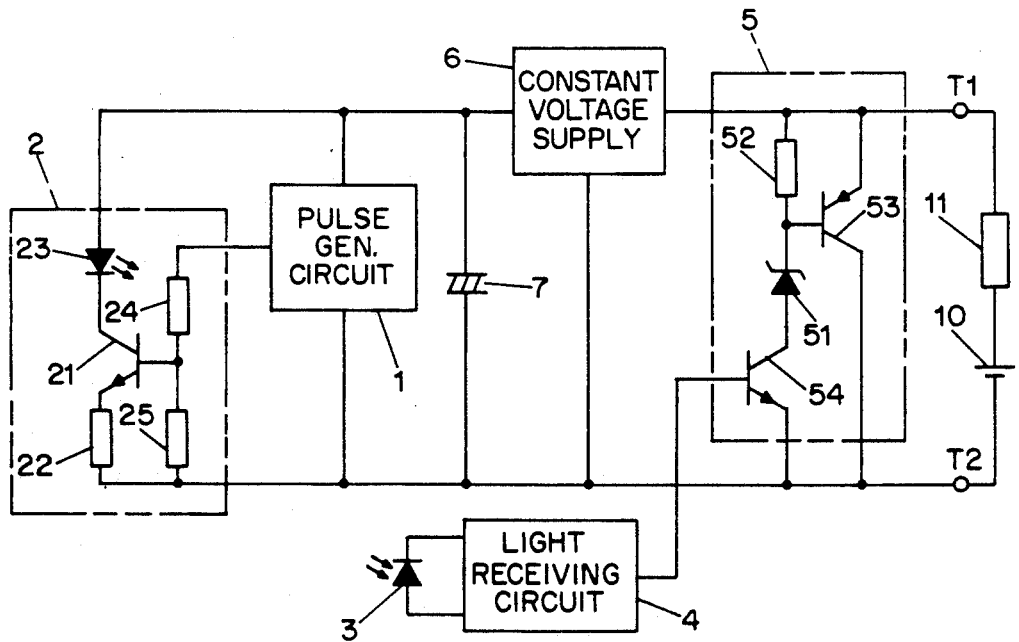
FIG. 6 is a circuit diagram of one example of a conventional photoelectric switch.

FIGS. 1 and 2 are circuit diagrams to illustrate a first preferred embodiment of the present invention and FIGS. 3 through 5 illustrate a second preferred embodiment. In FIGS. 1 through 5, the elements identical with those of the conventional structure shown in FIG. 6 are given the same reference numerals.

In FIG. 1, the transistor 81 and the resistor 82 comprise the switching circuit 8 of an emitter follower type, the transistor 81 being driven by the pulse generating circuit 1. The emitter of this transistor 81 serves as the output end of the switching circuit 8. The output end of the switching circuit 8 is connected to the auxiliary capacitor means 92, which is further coupled to a power supply (not shown) which connects to terminal means, shown as output terminals (T1 and T2), via the resistor 91 and the constant voltage power supply circuit 6. The capacitor 92 and the resistor 91 constitute a charging circuit. While the circuitry of the LED driving circuit 2 is similar to that of conventional circuits, the point connecting the capacitor 92 with the resistor 91 provides the input to the LED driving circuit 2.

An explanation is given to the case where a power supply and load (not shown) are connected to the output terminals (T1 and T2) in the photoelectric switch constructed as shown in FIG. 1. When the output of the pulse generating circuit 1 is "0", current will not flow into the bases of transistors 81 and 21. As a result, transistors 81 and 21 will not conduct and the light emitting device, shown as LED 23, will not turn on. During this time, the auxiliary capacitor 92 is charged via resistors 91 and 82 until its voltage reaches substantially the circuit voltage $V_{cc}$.

When the output of the pulse generating circuit 5 reaches "1", (a voltage approximating the circuit voltage $V_{cc}$), the voltage across the switching circuit, that is, the collector voltage at transistor 81 also approaches the circuit voltage, $V_{cc}$. Because the auxiliary capacitor 92 is charged to a stored voltage nearly equal to the circuit voltage $V_{cc}$ at this time, the LED driving circuit 2 is supplied with a composite drive voltage which is an enhanced voltage equal to approximately two times the circuit voltage $V_{cc}$. In the meantime, as soon as the output of the pulse generating circuit 1 reaches "1", the base current flows into transistor 21 in the LED driving circuit 2 via resistor 24, activating transistor 21. Thus, a current flows into the LED (23), and a pulse light is emitted. As a result, the LED 23 is driven by a driving voltage two times that of the circuit voltage $V_{cc}$ and emits a pulse light.

FIG. 2 is a variation of the embodiment of FIG. 1 in which the resistor 82 in the switching circuit 8 of FIG. 1 is replaced with a second transistor 83. In addition, a diode 93 is inserted in the charging circuit.

In FIG. 2, when the output of the pulse generating circuit is "0", second transistor 83 is activated with the capacitor 92 charged nearly to the circuit voltage $V_{cc}$, whereas transistor 83 does not conduct when first transistor 81 is activated when the output of the pulse generating circuit reaches "1". Therefore, no unnecessary current flows through resistor 82, as in the case of FIG. 1. In addition, since the diode 93 prevents the current from flowing back into the circuit through resistor 91 when the capacitor 92 is discharged, the circuit current can be reduced.

In each of FIGS. 1 and 2 described above, the circuit is structured so that the LED driving circuit 2 is driven by the output of the pulse generating circuit 1 through the switching circuit 8. However, if the pulse generating circuit 1 is given a sufficiently large current driving power, the switching circuit 8 may be omitted, and its output ma be replaced with the output of the pulse generating circuit 1.

FIG. 3 is a circuit diagram illustrating another embodiment of the present invention. In FIG. 3, the pulse generating circuit 1, the LED driving circuit 2, the light receiving circuit 4, the output circuit 5, and the constant voltage power supply circuit 6 are identical with those of the conventional structure shown in FIG. 6.

This embodiment differs from conventional circuitry in the location of a series combination of the resistor 12 and the power supply capacitor 13 between the terminals (T1 and T2), the auxiliary capacitor 92a, and the coupling transistor 14. Moreover, a diode 15 is connected in series with the LED 23. The switching circuit 8 comprises a series circuit of the transistor 81 and resistor 82, connected in parallel with the power supply capacitor 13. The base of transistor 81 is connected to the output of the pulse generating circuit. The auxiliary capacitor 92a is connected to the charging resistor 91 in series, and to transistor 81 in parallel. Coupling transistor 14 has a diode 15 connected between the LED 23 and the power supply capacitor 3. The emitter of coupling transistor 14 is connected between the charging resistor 91 and the auxiliary capacitor 92a. The collector of coupling transistor 14 is connected between the diode 15 and the LED 23. The base of coupling transistor 14 is connected to the collector of transistor 54 via resistor 16.

When the output of the light receiving circuit 4 is "0", both transistors 54 and 53 are off, as is coupling transistor 14. The voltage between the terminals (T1 and T2) during this time is relatively high. This voltage is used to charge the power supply capacitor 13 via resistor 12. The output of the power supply capacitor 13 is applied to the LED driving circuit 2 via the diode 15. When the output of the light receiving circuit 4 turns to "1", both transistors 54 and 53 turn on, and the voltage between the terminals (T1 and T2) decreases to the sum of the voltage $V_z$ at the Zener diode 51 and the voltage drop across the base-emitter of the output transistor 53. Therefore, the voltage at the power supply capacitor 13 also decreases and it is no longer capable of supplying a sufficient voltage to the LED driving circuit 2. During the pause in the pulse generating circuit 1, the transistor 81 is turned off, and thus the auxiliary capacitor 92a is charged via resistor 91. When the output of the pulse generating circuit 1 turns to "1", the coupling transistor 14 turns on, raising the output from the switching circuit 8, that is, the voltage across resistor 82. If the output circuit 5 and transistor 54 are on at this time, then coupling transistor 14 is also on. Thus, the LED driving circuit 2 is applied with the sum of the voltage across the auxiliary capacitor 92a, which is higher than the voltage across the power supply capacitor 13 and the output voltage from the switching circuit 8. Thus, the voltage needed to operate the LED driving circuit 2 can be assured.

FIG. 4 differs from FIG. 3 in that the series circuit of the charging resistor 91 and the auxiliary capacitor 92a is connected between the constant voltage power supply circuit 6 and the emitter of the transistor 21. Coupling diode 17 is connected between the charging resistor 91 and the auxiliary capacitor 92a and at its other end between diode 15 and the LED 23. In FIG. 4, when the output circuit 5 is off, the voltage at the power supply capacitor 13 is higher than the sum of the output voltages at the auxiliary capacitor 92a and the switching circuit 8 when the output from the pulse generating circuit 1 is "1". Therefore, coupling diode 17 is turned off due to a reverse bias, and the LED driving circuit 2 is supplied by the power supply capacitor via diode 15. During this time, the auxiliary capacitor 92a is charged, and when the output circuit 5 turns on, the voltage at the power supply capacitor 13 decreases. The sum of the voltage across the auxiliary capacitor 92a and the output voltage of the switching circuit 8 increase. Therefore, diode 17 becomes forward biased, and the LED driving circuit 2 is supplied via diode 17.

FIG. 5 differs from FIG. 3 in that the point connecting the charging resistor 91 with the auxiliary capacitor 92a and the point connecting diode 15 and the LED 23 are short circuited. The emitter and collector of the switching transistor 18 are connected between the output end of the pulse generating circuit 1 and the input end of the switching circuit 8. Moreover, the base of transistor 18 is connected to the collector of transistor 54 via resistor 19. Furthermore, resistor 20 is connected between the input end of the switching circuit 8 and the terminal T2.

When the output of the light receiving circuit 4 is "0" and the output circuit 5 is off, switching transistor 18 is turned off since transistor 54 is off as is transistor 21. At this time, resistor 20 turns off transistor 21. During the pause in the pulse generating circuit 1, the auxiliary capacitor 92a is charged to nearly the same voltage as that at the power supply capacitor 13. When the output of the pulse generating circuit turns to "1", the LED driving circuit 2 is supplied by both the power supply capacitor 13 and the auxiliary capacitor 92a, and the current supplied by the auxiliary capacitor 92a is limited by resistor 82, whereby the LED 23 emits light base on the current flowing from the power supply capacitor 13. When the output of the light receiving circuit 4 turns to "1", the output circuit 5 turns on, and the voltage across the power supply capacitor 13 decreases. Then, since transistor 54 turns on, transistor 18 is turned on, and an output signal is transmitted from the pulse generating circuit 1 to the switching circuit 8. Thus, the LED driving circuit 2 is supplied with the sum of the voltage across the auxiliary capacitor 92a and the output voltage of the switching circuit 8, in much the same way as in the above circuits.

In the preferred embodiments of the present invention, the current flowing in the circuits connected between the terminals (T1 and T2) other than the output circuit 5 is limited to leakage currents flowing into the load 11 when the output circuit 5 is turned off. However, in those circuits that differ from the conventional circuitry, the currents subjected to discussion are the current flowing in the switching circuit 8, and the charging currents for the capacitor 92 in FIGS. 1 and 2, and the auxiliary capacitor 92a and the power supply capacitor 13 in FIGS. 3 through 5. Nevertheless, the charging current flowing into each capacitor is a current flowing in the LED driving circuit 2, hence resulting in no substantial loading effect to the circuits, with only the current flowing in the switching circuit 8 remaining a subject of discussion. However, since this current is kept nearly constant regardless of whether the output circuit is turned off or on, it does not impair the practical performance of the circuit.

According to the present invention as described above, the first preferred embodiment is structured so that an auxiliary capacitor and a charging circuit are connected in series between a switching circuit driven by a pulse generating circuit and a circuit power supply to feed a composite drive voltage comprising the output voltage from this switching circuit and a stored voltage of the capacitor to an LED driving circuit when the switching circuit is turned on. Therefore, an enhanced drive voltage as high as about two times the circuit voltage is applied to the LED driving circuit, enabling the circuit to drive LED elements having a large voltage drop such as red or green LEDs, at a low circuit voltage. In this way, the drop in the drive voltage can be reduced when a photoelectric circuit using an LED in its light projecting circuit is turned on, thus making it possible to provide a photoelectric switch which operates at a reduced power supply voltage.

In the second preferred embodiment, when the output circuit is turned on, the LED driving circuit is supplied with a composite drive voltage comprising the sum of the output voltage from the switching circuit driven by the pulse generating circuit and the stored voltage across the auxiliary capacitor charged during a pause in the lighting pulse. When the output circuit is turned off, the LED driving circuit is supplied by the power supply capacitor charged by the input side of a constant voltage power supply circuit. This makes it possible to operate the LED driving circuit free of impairment even if the voltage drop is reduced when the output circuit is turned on. Moreover, because the leakage current when the output circuit is turned off will not exceed the leakage current when it is turned on, performance is improved.

While there have been described what are believed to be the preferred embodiments of the invention, those skilled in the art will recognize that other and further modifications may be made thereto without departing from the invention, and it is intended to claim all such changes and modifications as fall within the scope of the invention.

We claim:

1. In a photoelectric switch, wherein a light emitting device emits light pulses in response to a pulse signal and a light receiving circuit provides output signals in response to said light pulses, the combination for enhancing light emitting device drive voltage, comprising:
   terminal means for coupling a supply voltage;
   auxiliary capacitor means, coupled to said terminal means, for charging to a stored voltage;
   pulse generating means, coupled to said terminal means, for generating a pulse signal;
   a light emitting device for providing light pulses;
   driving circuit means, coupled to said light emitting device and responsive to said pulse signal, for activating said light emitting device; and
   switching circuit means, coupled to said terminal means and responsive to said pulse signal, for coupling to said light emitting device a composite drive voltage substantially equal to the voltage across said switching circuit means, plus said stored voltage of said auxiliary capacitor means;
   whereby, an enhanced drive voltage is provided to said light emitting device.

2. A photoelectric switch as in claim 1, wherein said switching circuit means comprises the series combination of a resistor and a transistor arranged to become conductive in response to said pulse signal.

3. A photoelectric switch as in claim 2, wherein said voltage across said switching circuit is substantially equal to said supply voltage.

4. A photoelectric switch as in claim 1, wherein said switching circuit means comprises the series combination of two transistors, a first transistor arranged to become conductive in response to said pulse signal so as to couple said composite drive voltage to said light emitting device and a second transistor, coupling said first transistor in series with said terminal means, which is normally conductive and is arranged to become nonconductive in response to said pulse signal.

5. A photoelectric switch as in claim 1, additionally comprising:
   a light receiving circuit, responsive to said light pulses, activating an output circuit whose operation loads down and decreases said supply voltage; and
   a coupling transistor, coupling said composite drive voltage to said light emitting device, arranged to become conductive when said output circuit is activated;
   whereby, said composite drive voltage is coupled to said light emitting device only in periods when said supply voltage decreases on activation of said output circuit.

6. A photoelectric switch as in claim 5, wherein said switching circuit means comprises the series combination of a resistor and a transistor arranged to become conductive in response to said pulse signal.

7. A photoelectric switch as in claim 1, additionally comprising:
   a power supply capacitor coupled in series with said terminal means and arranged to provide a drive voltage to said light emitting device;
   a constant voltage supply, coupled to said terminal means, for providing a constant voltage to said auxiliary capacitor means; and
   a coupling diode, coupling said composite drive voltage to said light emitting device, arranged to become conductive when said constant voltage exceeds said supply voltage;
   whereby, said composite drive voltage is coupled to said light emitting device in periods of decreased supply voltage.

8. A photoelectric switch as in claim 7, wherein said switching circuit means comprises the series combination of a resistor and a transistor arranged to become conductive in response to said pulse signal.

9. A photoelectric switch as in claim 1, additionally comprising:
   a power supply capacitor coupled in series with said terminal means and arranged to provide a drive voltage to said light emitting device;
   a constant voltage supply, coupled to said terminal means, for providing a constant voltage to said auxiliary capacitor means;
   a light receiving circuit, responsive to said light pulses, activating an output circuit whose operation loads down and decreases said supply voltage; and
   a switching transistor, coupling said pulse generating means to said switching circuit means, arranged to become conductive when said output circuit is activated;

whereby, said pulse generating means is coupled to said switching circuit means in periods of decreased supply voltage.

10. A photoelectric switch as in claim 9, wherein said switching circuit means comprises the series combination of a resistor and a transistor arranged to become conductive in response to said pulse signal.

11. In a photoelectric switch, wherein a light emitting device emits light pulses in response to a pulse signal and a light receiving circuit provides output signals in response to said light pulses, the combination for enhancing light emitting device drive voltage, comprising:

terminal means for coupling a supply voltage;

auxiliary capacitor means, coupled to said terminal means, for charging to a stored voltage;

a light emitting device for providing light pulses;

pulse generating means, coupled to said terminal means, for generating a pulse signal and for coupling to said light emitting device a composite drive voltage including said stored voltage of said auxiliary capacitor means; and driving circuit means, coupled to said light emitting device and responsive to said pulse signal, for activating said light emitting device;

whereby, an enhanced drive voltage is provided to said light emitting device.

12. A photoelectric switch as in claim 11, additionally comprising:

a light receiving circuit, responsive to said light pulses, activating an output circuit whose operation loads down and decreases said supply voltage; and a coupling transistor, coupling said composite drive voltage to said light emitting device, arranged to become conductive when said output circuit is activated;

whereby, said composite drive voltage is coupled to said light emitting device only in periods when said supply voltage decreases on activation of said output circuit.

13. A photoelectric switch as in claim 11, additionally comprising:

a power supply capacitor coupled in series with said terminal means and arranged to provide a drive voltage to said light emitting device;

a constant voltage supply, coupled to said terminal means, for providing a constant voltage to said auxiliary capacitor means; and a coupling diode, coupling said composite drive voltage to said light emitting device, arranged to become conductive when said constant voltage exceeds said supply voltage;

whereby, said composite drive voltage is coupled to said light emitting device in periods of decreased supply voltage.

* * * * *